(12) United States Patent
Yang et al.

(10) Patent No.: US 11,664,451 B2
(45) Date of Patent: May 30, 2023

(54) METHOD AND DEVICE FOR BOOSTING PERFORMANCE OF FINFETS VIA STRAINED SPACER

(71) Applicant: Taiwan Semiconductor Manufacturing Co., Ltd., Hsin-Chu (TW)

(72) Inventors: Kai-Chieh Yang, Kaohsiung (TW); Li-Yang Chuang, Hsinchu (TW); Pei-Yu Wang, Hsinchu (TW); Wei Ju Lee, Hsinchu (TW); Ching-Wei Tsai, Hsinchu (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 61 days.

(21) Appl. No.: 17/216,241

(22) Filed: Mar. 29, 2021

(65) Prior Publication Data
US 2021/0217890 A1    Jul. 15, 2021

Related U.S. Application Data

(63) Continuation of application No. 16/441,080, filed on Jun. 14, 2019, now Pat. No. 10,964,816.

(60) Provisional application No. 62/737,238, filed on Sep. 27, 2018.

(51) Int. Cl.
| | | |
|---|---|---|
| *H01L 29/78* | (2006.01) | |
| *H01L 29/08* | (2006.01) | |
| *H01L 27/092* | (2006.01) | |
| *H01L 21/8238* | (2006.01) | |

(52) U.S. Cl.
CPC .. *H01L 29/7843* (2013.01); *H01L 21/823814* (2013.01); *H01L 21/823821* (2013.01); *H01L 21/823864* (2013.01); *H01L 27/0924* (2013.01); *H01L 29/0847* (2013.01)

(58) Field of Classification Search
CPC ........ H01L 29/7843; H01L 21/823814; H01L 21/823821; H01L 21/823864; H01L 27/0924; H01L 29/0847; H01L 29/6653; H01L 29/6681; H01L 21/823807; H01L 27/092; H01L 27/0886; H01L 29/0649; H01L 29/0653
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |

(Continued)

*Primary Examiner* — Kyoung Lee
(74) *Attorney, Agent, or Firm* — Haynes and Boone, LLP

(57) ABSTRACT

A semiconductor device and a method of forming the same are provided. A semiconductor device according to an embodiment includes a P-type field effect transistor (PFET) and an N-type field effect transistor (NFET). The PFET includes a first gate structure formed over a substrate, a first spacer disposed on a sidewall of the first gate structure, and an unstrained spacer disposed on a sidewall of the first spacer. The NET includes a second gate structure formed over the substrate, the first spacer disposed on a sidewall of the second gate structure, and a strained spacer disposed on a sidewall of the first spacer.

20 Claims, 17 Drawing Sheets

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,304,940 B1 * | 5/2019 | Ghani .................. H01L 29/167 |
| 2009/0294866 A1 | 12/2009 | Eller |

* cited by examiner

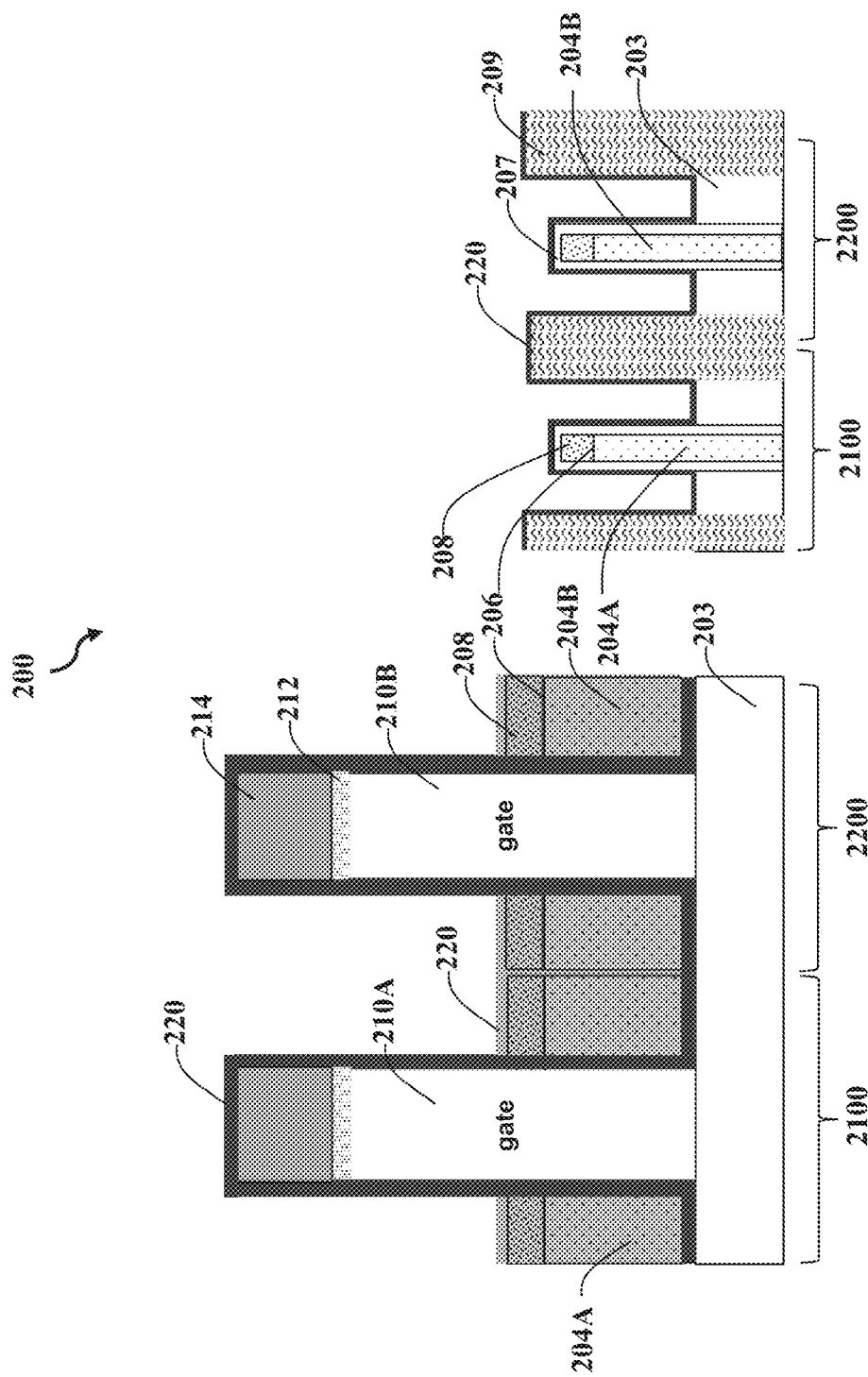

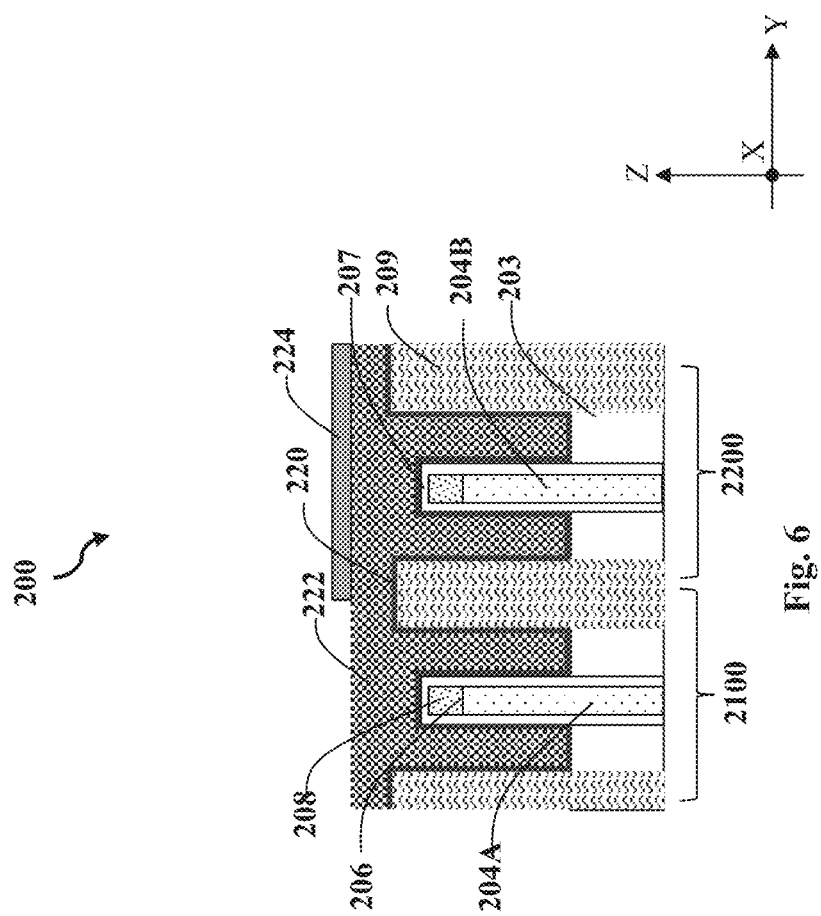

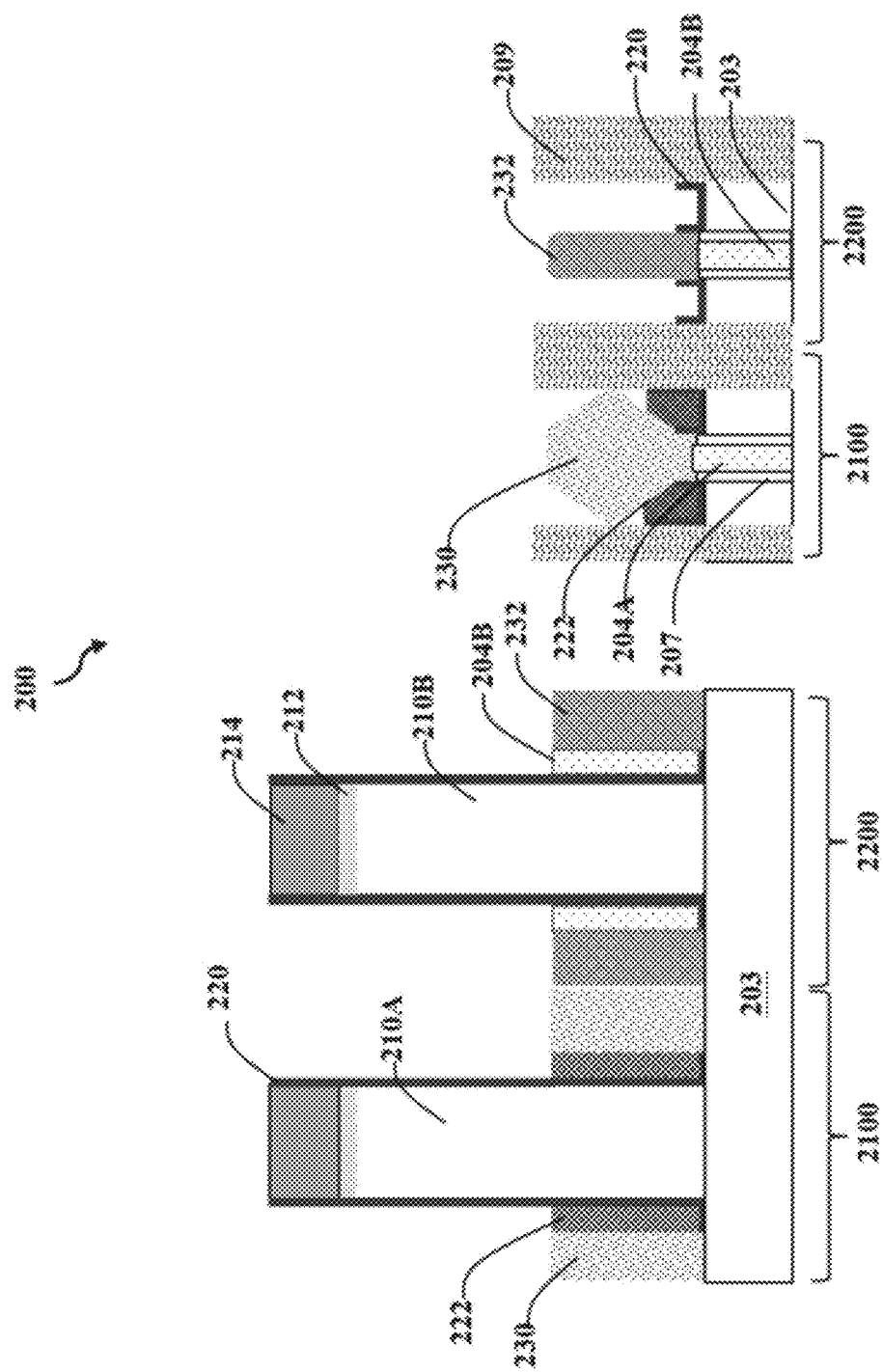

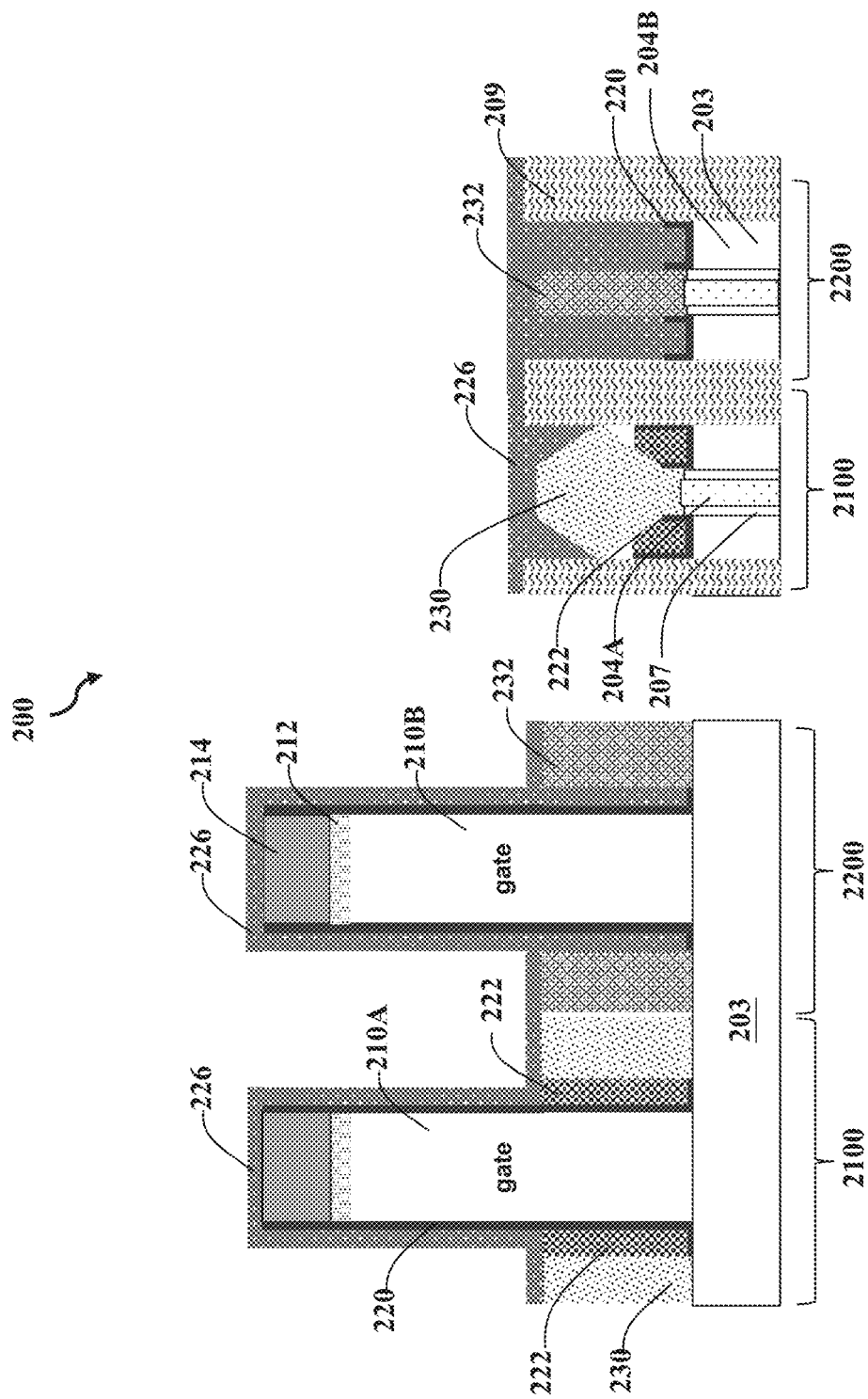

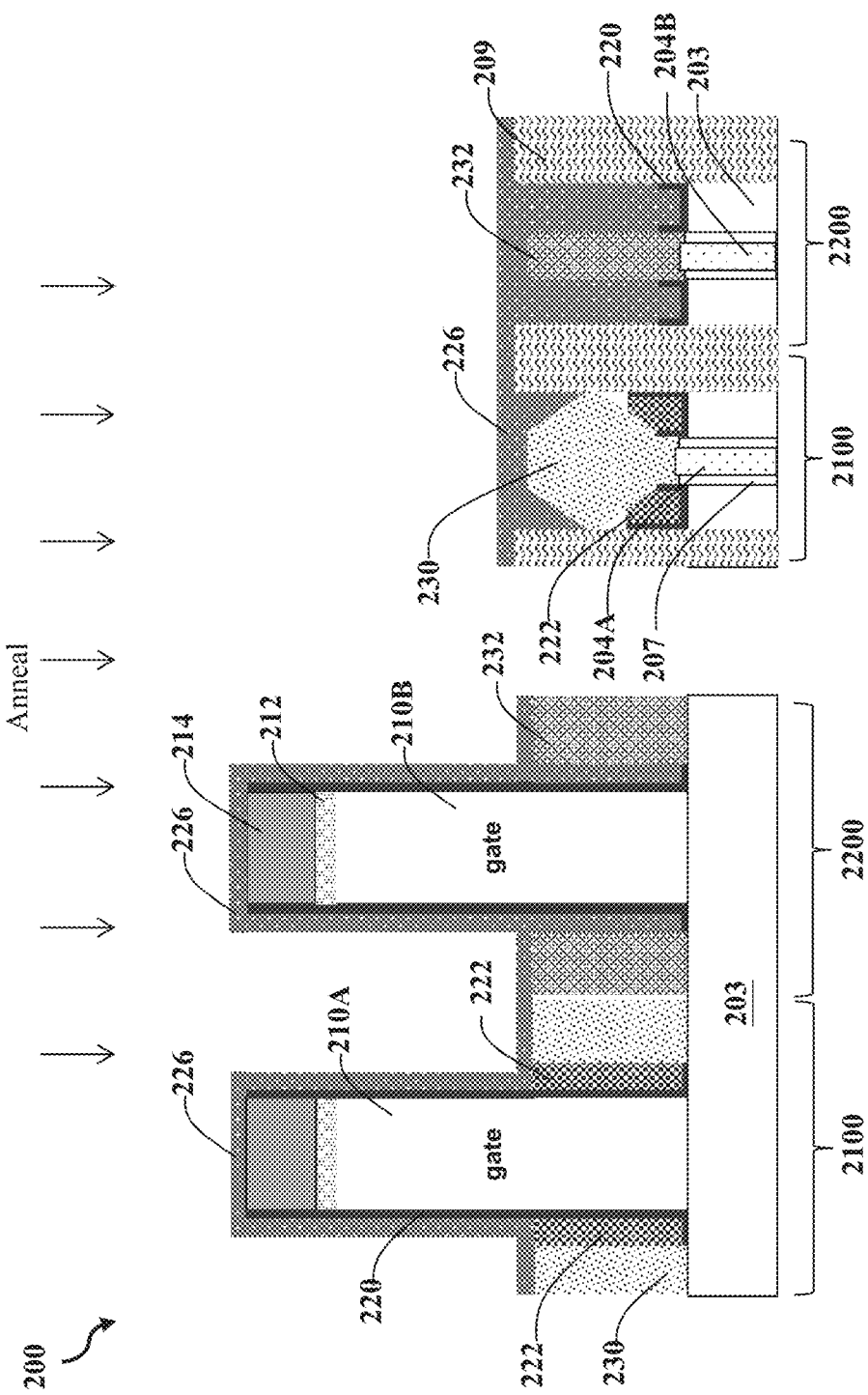

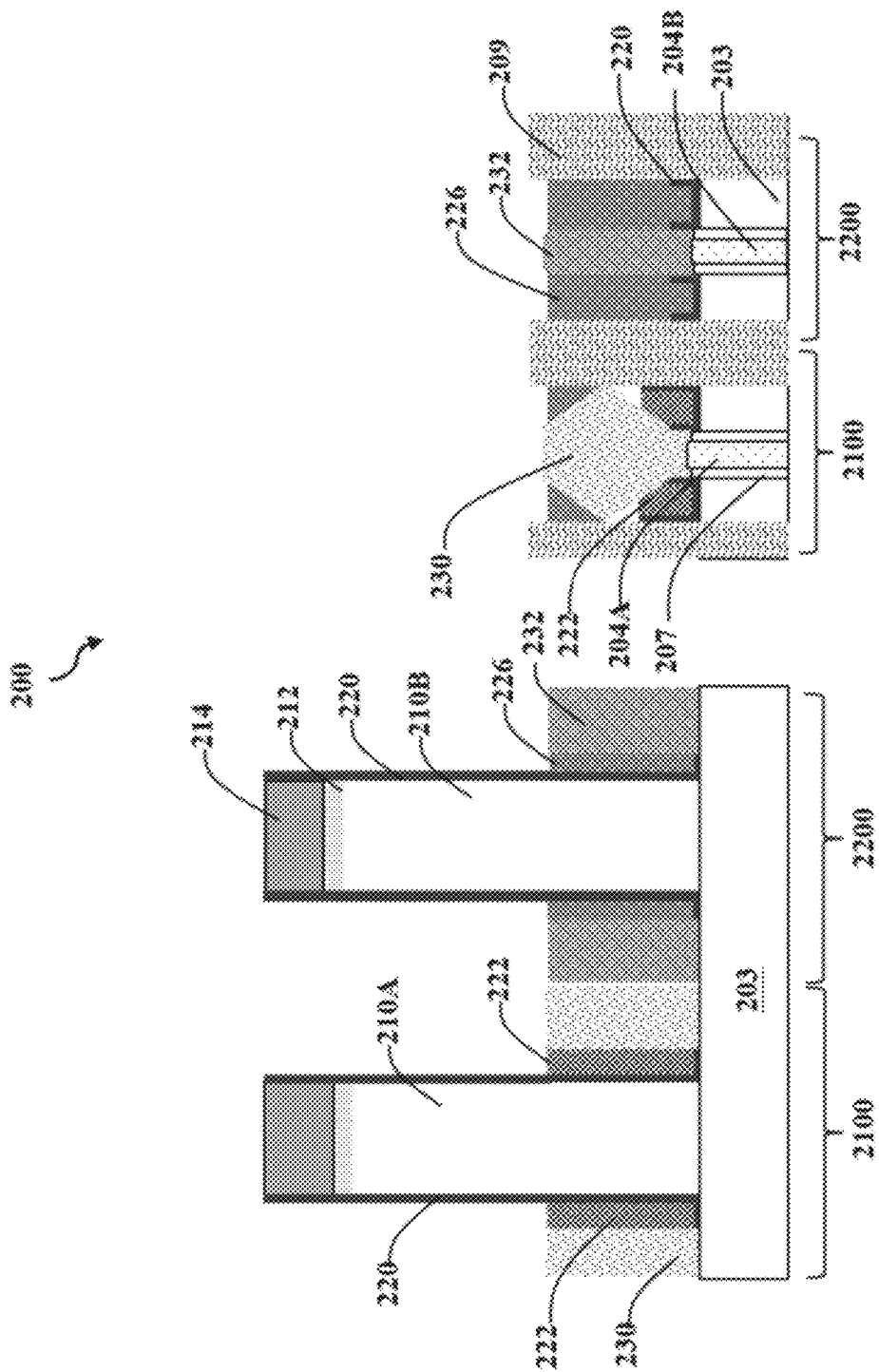

US 11,664,451 B2

METHOD AND DEVICE FOR BOOSTING PERFORMANCE OF FINFETS VIA STRAINED SPACER

PRIORITY DATA

This application is a continuation application of U.S. patent application Ser. No. 16/441,080, filed Jun. 14, 2019, which claims benefits of U.S. Provisional Patent Application No. 62/737,238, filed Sep. 27, 2018, each of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, such scaling down has also increased the complexity of processing and manufacturing ICs and, for these advances to be realized. Similar developments in IC processing and manufacturing are needed. For example, a three-dimensional transistor, such as a fin-like field-effect transistor (FinFET), has been introduced to replace a planar transistor. A FinFET can be thought of as a typical planar device extruded into the gate. A typical FinFET is fabricated with a thin "fin" (or fin structure) extending up from a substrate. The channel of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of ways, and in some applications, FinFETs provide reduced short channel effects, reduced leakage, and higher current flow. In other words, they may be faster, smaller, and more efficient than planar devices.

FinFETs include gate spacers over sidewalls of gate structures to isolate gate structures from adjacent structures such as source/drain contacts and to protect gate structures (or placeholder gate structures) from being damaged during fabrication processes. While conventional gate spacers are generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIGS. 2, 3A, 3B, 4A, 4B, 5A, 5B, 6-11, 12A, 12B, 13A, 13B, 14A, 14B, 15A, 15B, 16A, 16B, 17A, and 17B are fragmentary cross-sectional diagrammatic views of a workpiece at various fabrication stages of a method, such as the method in FIG. 1, according to various aspects of the present disclosure.

DETAILED DESCRIPTION

Figure 1:
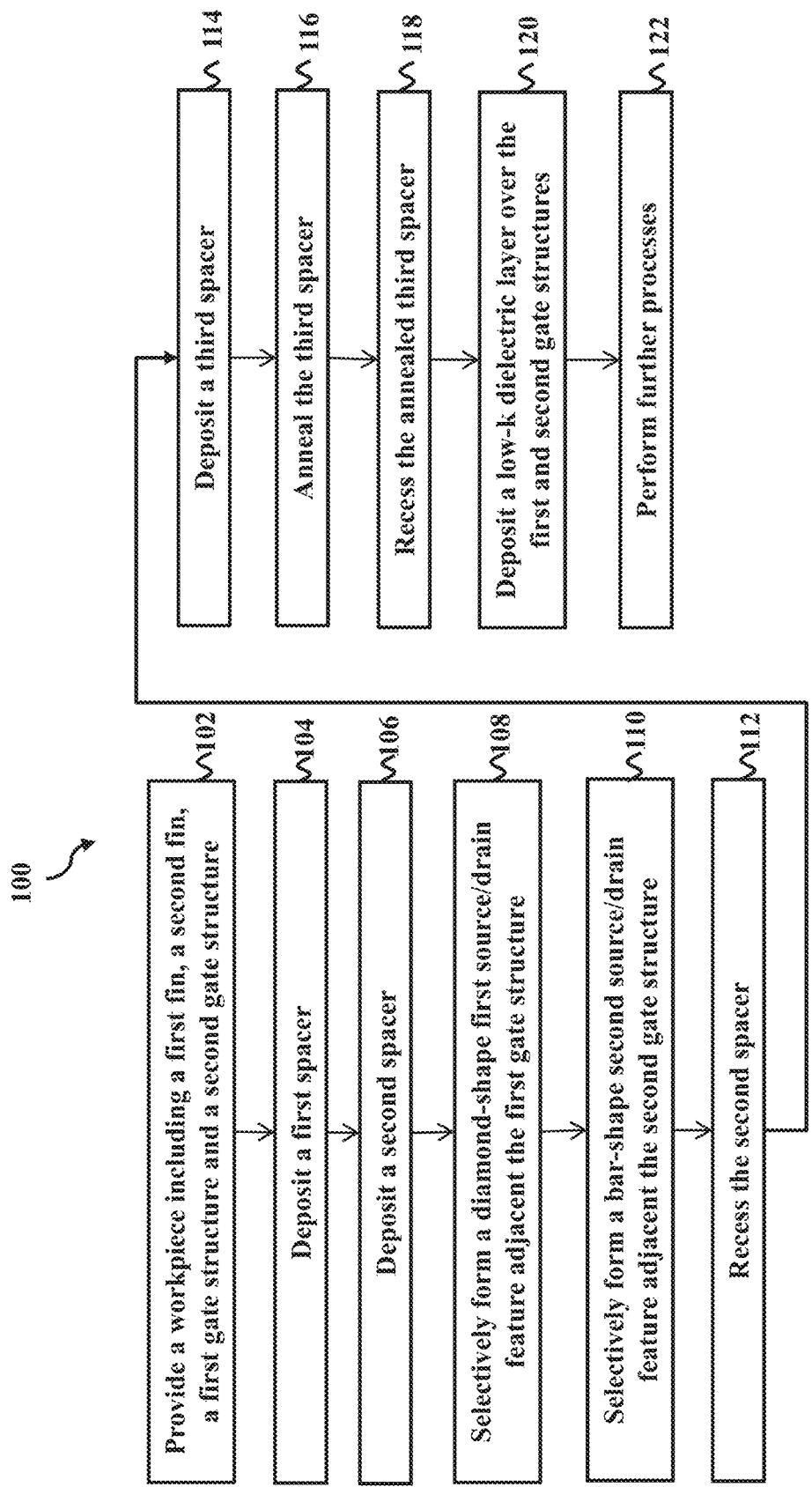
FIG. 1 is a flow diagram of a method for fabricating a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a strained spacer to be formed over the N-type gate structures of a semiconductor device, such as a FinFET to increase electron mobility in the N-type channel regions, thereby increasing the drain current and speed. In some embodiments, a conventional unstrained spacer may be recessed and replaced with a spacer that becomes strained after annealing. The strained spacer can cause a tensile stress exerted on the N-type channel region. It has been observed that such tensile stress improves electron mobility in the N-type channel region. The improved electron mobility in the N-type channel region can lead to increased drain current and faster switching speed.

To illustrate the various aspects of the present disclosure, a FinFET fabrication process is discussed below as an example. In that regard, a FinFET device is a fin-like field-effect transistor device, which has been gaining popularity in the semiconductor industry. The FinFET device may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure, but it is understood that the application is not limited to the FinFET device, except as specifically claimed.

FIG. 1 illustrates a flow chart of a method 100 for fabricating a semiconductor device. At block 102 of the method 100, a workpiece is provided. The workpiece includes a first fin in a P-type device region, a second fin in an N-type device region, a first gate structure over the first fin, and a second gate structure over the second fin. At block 104 of the method 100, a first spacer is deposited over the workpiece. At block 106 of the method 100, a second spacer is deposited over the workpiece. At block 108 of the method 100, a diamond-shape first source/drain feature is selectively formed adjacent the first gate structure. At block 110 of the method 100, a bar-shape second source/drain feature is selectively formed adjacent the second gate structure. At block 112 of the method 100, the second spacer is recessed. At block 114 of the method 100, a third spacer is deposited over the workpiece. At block 116 of the method 100, the third spacer is annealed and strained. At block 118 of the method 100, the annealed third spacer is recessed. At block 120 of the method 100, a low-k dielectric layer is deposited over the first and second gate structures. At block 122 of the method 100, further processes may be performed to complete fabrication of the semiconductor device. Additional steps can be provided before, during, and after the method 100, and some of the steps described can be replaced or eliminated for other embodiments of the method 100.

Figure 2:
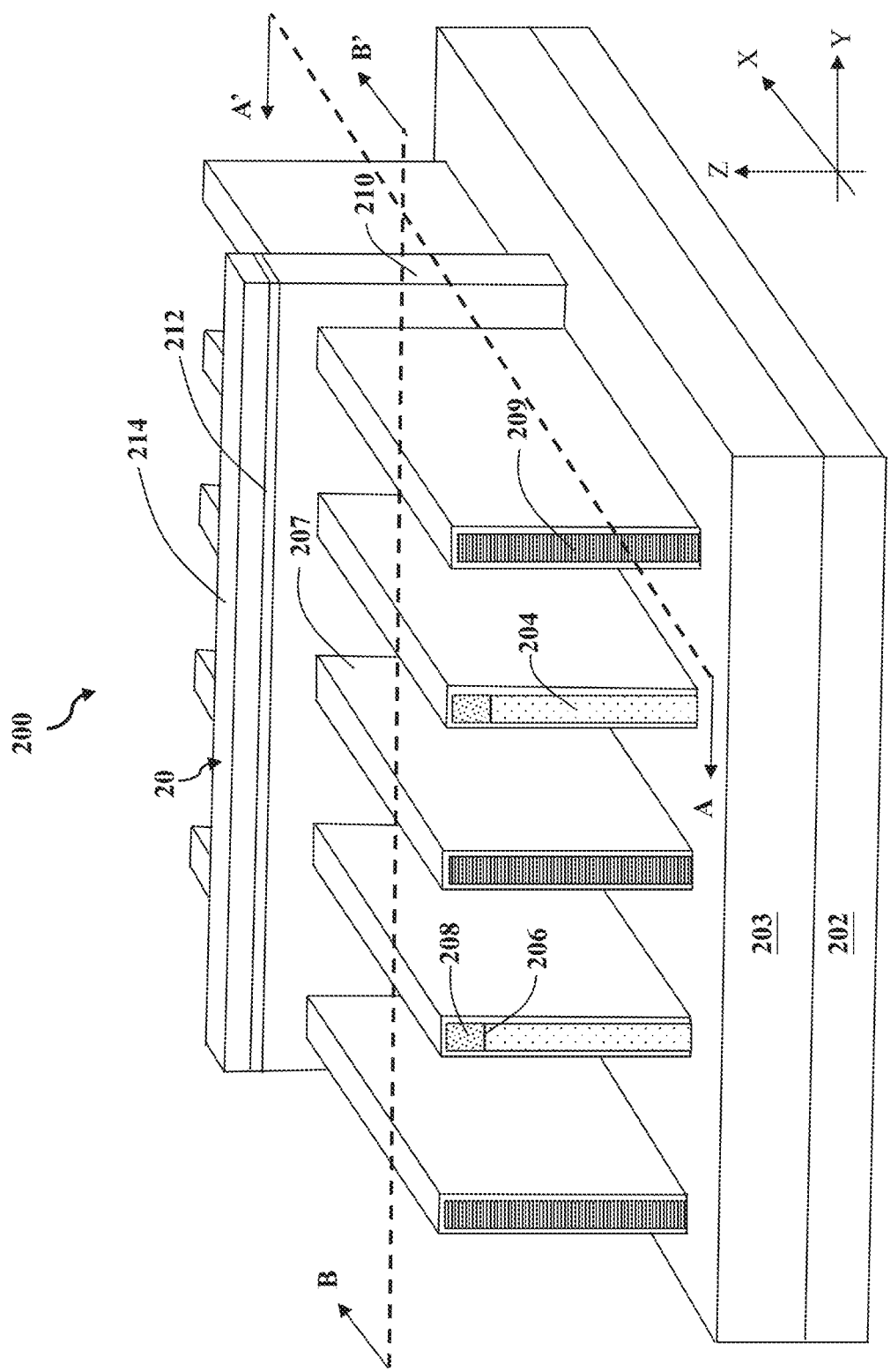

Blocks of the method 100 in FIG. 1 may be better described in conjunction with FIGS. 3A, 3B, 4A, 4B, 5A, 5B, 6-11, 12A, 12B, 13A, 13B, 14A, 14B, 15A, 15B, 16A, 16B, 17A, and 17B. FIGS. 3A, 3B, 4A, 4B, 5A, 5B, 6-11, 12A, 12B, 13A, 13B, 14A, 14B, 15A, 15B, 16A, 16B, 17A, and 17B are fragmentary cross-sectional diagrammatic views of a workpiece 200 of an integrated circuit (IC) device at various fabrication stages of a method of the present disclosure, such as method 100 of FIG. 1. A perspective diagrammatic view of the workpiece 200 is illustrated in FIG. 2. The workpiece 200 can be included in a microprocessor, a memory, and/or other IC device. In some implementations, workpiece 200 is a portion of an IC chip, a system on chip (SoC), or portion thereof, that includes various passive and active microelectronic devices, such as resistors, capacitors, inductors, diodes, p-type field effect transistors (PFETs), N-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or non-planar transistors, such as fin-like FETs (FinFETs) or gate-all-around (GAA) transistors. FIGS. 2, 3A, 3B, 4A, 4B, 5A, 5B, 6-11, 12A, 12B, 13A, 13B, 14A, 14B, 15A, 15B, 16A, 16B, 17A, and 17B have been simplified for the sake of clarity to better understand the inventive concepts of the present disclosure. Additional features can be added in workpiece 200, and some of the features described below can be replaced, modified, or eliminated in other embodiments of workpiece 200.

Reference is now made to FIG. 2, which aids understanding of cross-sectional views shown in FIGS. 3A, 3B, 4A, 4B, 5A, 5B, 6-11, 12A, 12B, 13A, 13B, 14A, 14B, 15A, 15B, 16A, 16B, 17A, and 17B. The workpiece 200 includes a substrate 202. The substrate 202 may be made of silicon or other semiconductor materials. Alternatively or additionally, the substrate 202 may include other elementary semiconductor materials such as germanium. In some embodiments, the substrate 202 is made of a compound semiconductor such as silicon carbide, gallium arsenic, indium arsenide, or indium phosphide. In some embodiments, the substrate 202 is made of an alloy semiconductor such as silicon germanium, silicon germanium carbide, gallium arsenic phosphide, or gallium indium phosphide. In some embodiments, the substrate 202 includes an epitaxial layer. For example, the substrate 202 may include an epitaxial layer overlying a bulk semiconductor.

The workpiece 200 also includes one or more fin structures 204 (e.g., Si fins) that extend from the substrate 202 in the Z-direction. In some embodiments illustrated in FIG. 2, a top surface of the fin structure 204 may be protected by one or more fin-top hard mask layers, such as a first fin-top hard mask layer 206 and a second fin-top hard mask layer 208. The first and second fin-top hard mask layers 206 and 208 may be formed of suitable dielectric materials. In one example, the first fin-top hard mask layer 206 is formed of semiconductor nitride, such as silicon nitride, and the second fin-top hard mask layer 208 is formed of semiconductor oxide, such as silicon oxide. In some embodiments, the fin structures 204, along with the first and second fin-top hard mask layers 206 and 208, may be surrounded by a fin spacer 207. In other embodiments, the fin spacer 207 is not formed. That is, in those embodiments, the fin spacer 207 is disposed on sidewalls of the fin structures 204, sidewalls of the first and second fin-top hard mask layers 206 and 208, and a top surface of the second fin-top hard mask layer 208. The fin structures 204 extend or are elongated along the X-direction and may optionally include germanium (Ge). The fin structures 204 may be formed by using suitable processes such as photolithography and etching processes. In some embodiments, the fin structure 204 is etched from the substrate 202 using dry etch or plasma processes. In some other embodiments, the fin structure 204 can be formed by a double-patterning lithography (DPL) process, a quadruple-patterning lithography (QPL) process or a multiple-patterning lithography (MPL) process. Generally, DPL, QPL and MPL processes combine photolithography and self-aligned processes, allowing patterns to be created that have, for example, pitches smaller than what is otherwise obtainable using a single, direct photolithography process. The fin structure 204 may include an epi-grown material, which may (along with portions of the fin structure 204) serve as the source/drain of the FinFET device to be constructed on the workpiece 200.

In some embodiments represented in FIG. 2, the workpiece 200 includes one or more dummy fins 209 (or hybrid fins 209). Dummy fins 209 may be formed to interleave between the fin structures 204 to provide compartmentation isolating semiconductor devices to be formed on the workpiece 200. In some implementations, the dummy fins 209 may be formed of silicon nitride (SiN), silicon oxynitride (SiON), silicon oxycarbonitride (SiOCN), silicon oxycarbide (SiOC), aluminum oxide ($AlO_3$), zirconium oxide ($ZrO_2$), yttrium oxide ($Y_2O_3$), hafnium oxide ($HfO_2$), titanium oxide ($TiO_2$), tantalum oxide ($Ta_2O_5$), or other suitable dielectric material. In some instances, like the fin structures 204, the dummy fins 209 may also be surrounded by the fin spacer 207.

An isolation structure 203, such as a shallow trench isolation (STI) structure, is formed to surround the fin structures 204 and the dummy fins 209. In some embodiments, a lower portion of the fin structures 204 and the dummy fins 209 is surrounded by the isolation structure 203, and an upper portion of the fin structures 204 and the dummy fins 209 protrudes from the isolation structure 203, as shown in FIG. 2. In other words, a portion of the fin structure 204 and dummy fins 209 is embedded in the isolation structure 203. The isolation structure 203 prevents electrical interference or crosstalk.

The workpiece 200 also includes a gate structure 210 that is formed over the fin structures 204 and the dummy fins 209. Depending on the process, the gate structure 210 may be a dummy gate structure (or placeholder gate structure) or a functional metal gate structure. When the gate structure 210 is a dummy gate structure in a gate-last process, the workpiece 200 may include a dummy gate dielectric layer between the gate structure 210 and the fin structures 204 as well as between the gate structure 210 and the dummy fins 209. In the gate-last process, the dummy gate structure and the dummy gate dielectric layer will be replaced with a gate dielectric layer and a metal gate structure. When the gate structure 210 is a functional gate structure in a gate-first process, the workpiece 200 may include a gate dielectric layer between the gate structure 210 and the fin structures 204 as well as between the gate structure 210 and the dummy fins 209. The gate structure 210 may include polysilicon when it is a dummy gate structure or metal (or metal nitride) when it is a functional metal gate structure. Such metal (or metal nitride) includes tantalum nitride (TaN), nickel silicide (NiSi), cobalt silicide (CoSi), molybdenum (Mo), copper (Cu), tungsten (W), aluminum (Al), nickel (Ni), cobalt (Co), zirconium (Zr), platinum (Pt), ruthenium (Ru), or other applicable materials. Gate-top hard mask layers may be used to define the gate electrode 210. In some instances, the gate-top hard mask layers may include a first gate-top hard mask layer 212 and a second gate-top hard mask layer 214. In some implementations, the first gate-top hard mask layer 212 may include semiconductor nitride, such as silicon nitride, and the second gate-top hard mask layer 214 may include semiconductor oxide, such as silicon oxide.

The gate dielectric layer may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof. In some embodiments, the gate structure 210 includes additional layers, such as interfacial layers, capping layers, diffusion/barrier layers, or other applicable layers.

The gate structure 210 may be formed by a deposition process, a photolithography process and an etching process. The deposition process includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

FIGS. 3A, 4A, 5A, 12A, 13A, 14A, 15A, 16A, and 17A illustrate cross-sectional diagrammatic views of the workpiece 200 along section A-A' shown in FIG. 2. FIGS. 3B, 4B, 5B, 6-11, 12B, 13B, 14B, 15B, 16B, and 17B illustrate cross-sectional diagrammatic views of the workpiece 200 along section B-B' shown in FIG. 2. It is noted that the figures in the present disclosure are representative for illustration purposes and are not limiting unless otherwise specified in the claims. For example, while no device regions are specified in FIG. 2, FIG. 2 may include more than one device regions, such as a P-type device region and an N-type device region. For another example, while only one gate structure 210 is illustrated in FIG. 2 and the gate structure 210 spans across multiple fin structures 204 and dummy fins 209, the gate structure 210 may be separated by gate cut processes into more than one segment and may only span across a single fin structure. For yet another example, while the dummy fins 209 appear to be equal-pitched such that each of the dummy fins 209 is spaced apart from an adjacent fin structure 204 by a constant distance, the dummy fins 209 may have uneven pitches and therefore may not be perfectly interleaved with the fin structures 204. In some implementations, the channel lengths of the FinFETs to be formed in the workpiece 200 may be equal to or less than about 12 nanometers (nm), the pitch of the gate structures 210 may be in a range between about 40 nm and about 45 nm, the pitch of the fin structures 204 may be in a range between about 20 nm and about 30 nm, and the width of the fin structures 204 may be in a range between about 2 nm and about 8 nm.

Figures 3A, 3B:
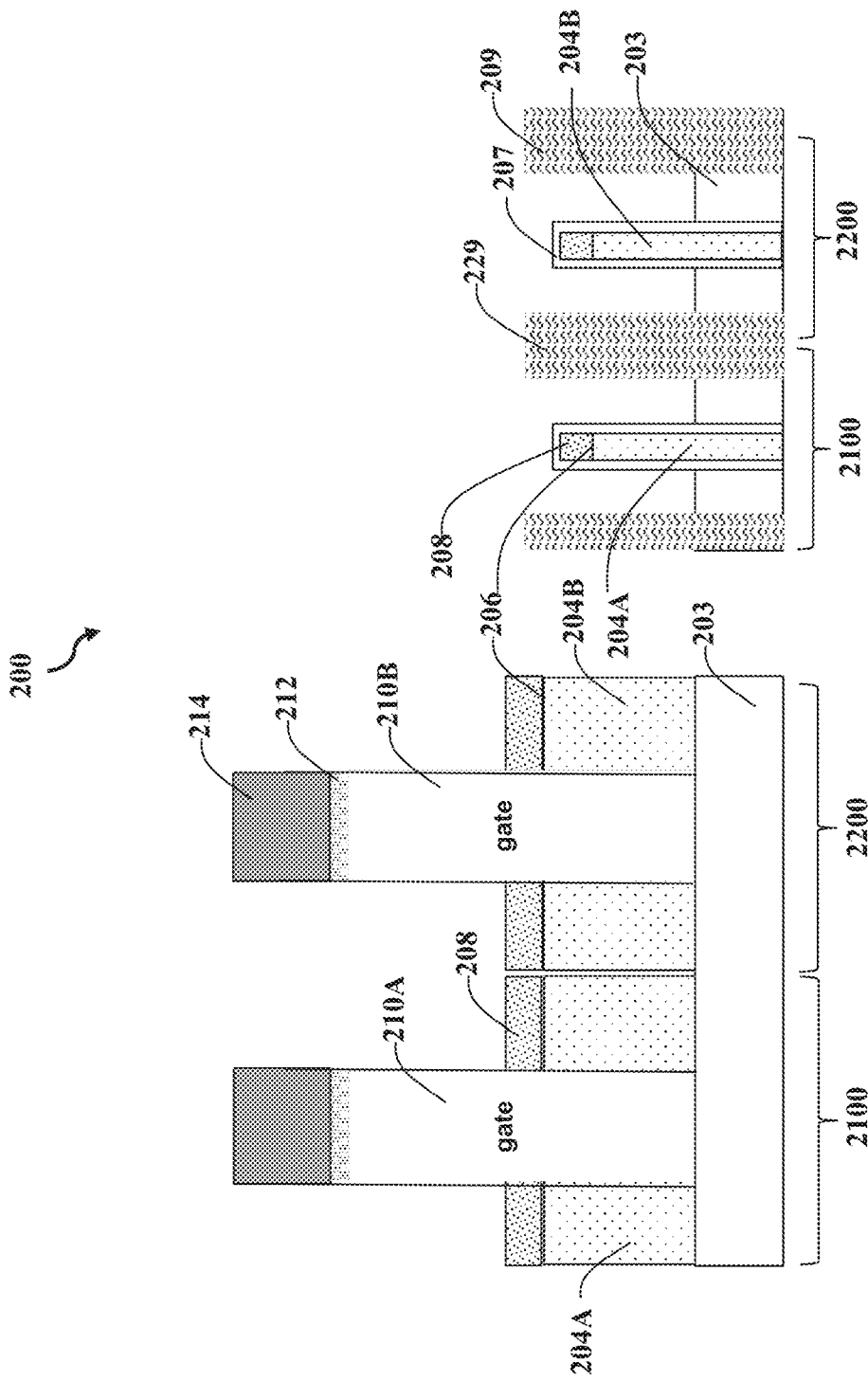

Referring now to FIG. 1, FIGS. 3A and 3B, the method 100 includes a block 102 where a workpiece 200 is provided. The workpiece 200 includes a first fin 204A in a P-type device region 2100, a second fin 204B in an N-type device region 2200, a first gate structure 210A over the first fin 204A, and a second gate structure 210B over the second fin 204B. Throughout figures of the present disclosure while the P-type device region 2100 and the N-type device region 2200 are illustrated as being adjacent to one another for ease of illustration and comparison, the P-type device region 2100 and the N-type device region 2200 need not be placed together. For example, the P-type device region 2100 may be spaced apart from the N-type device region 2200.

Referring now to FIG. 1, FIGS. 4A and 4B, the method 100 includes a block 104 where a first spacer 220 is deposited over the workpiece 200, including over the first gate structure 210A, the second gate structure 210B, the first fin 204A, the second fin 204B, the dummy fins 209, and the isolation structure 203. In some implementations, the first spacer 220 is disposed on sidewalls of the first gate structure 210A, second gate structure 210B, on fin spacer 207 disposed on the first fin 204A, the second fin 204B, and the dummy fin 209. It is noted that for clarity of illustration, fin spacer 207 on the dummy fins 209 is not separately illustrated in FIGS. 4A and 4B and subsequent figures. In some instances, the first spacer 220 is formed of a dielectric material so selected such that the first spacer 220 etches slower than other spacers (the second spacer 222 and the third spacer, to be described below). In some implementations, the first spacer 220 may comprise silicon, oxygen, nitrogen and carbon and may be formed to a thickness between about 0.5 nm and about 1.5 nm. In some instances, the composition of the first spacer 220 may be represented as $Si_xO_yC_zN_{1-x-y-z}$, where Z is greater than 40% to increase etching resistance. For example, the first spacer 220 may be formed of silicon carbonitride (SiCN).

Figures 5A, 5B:
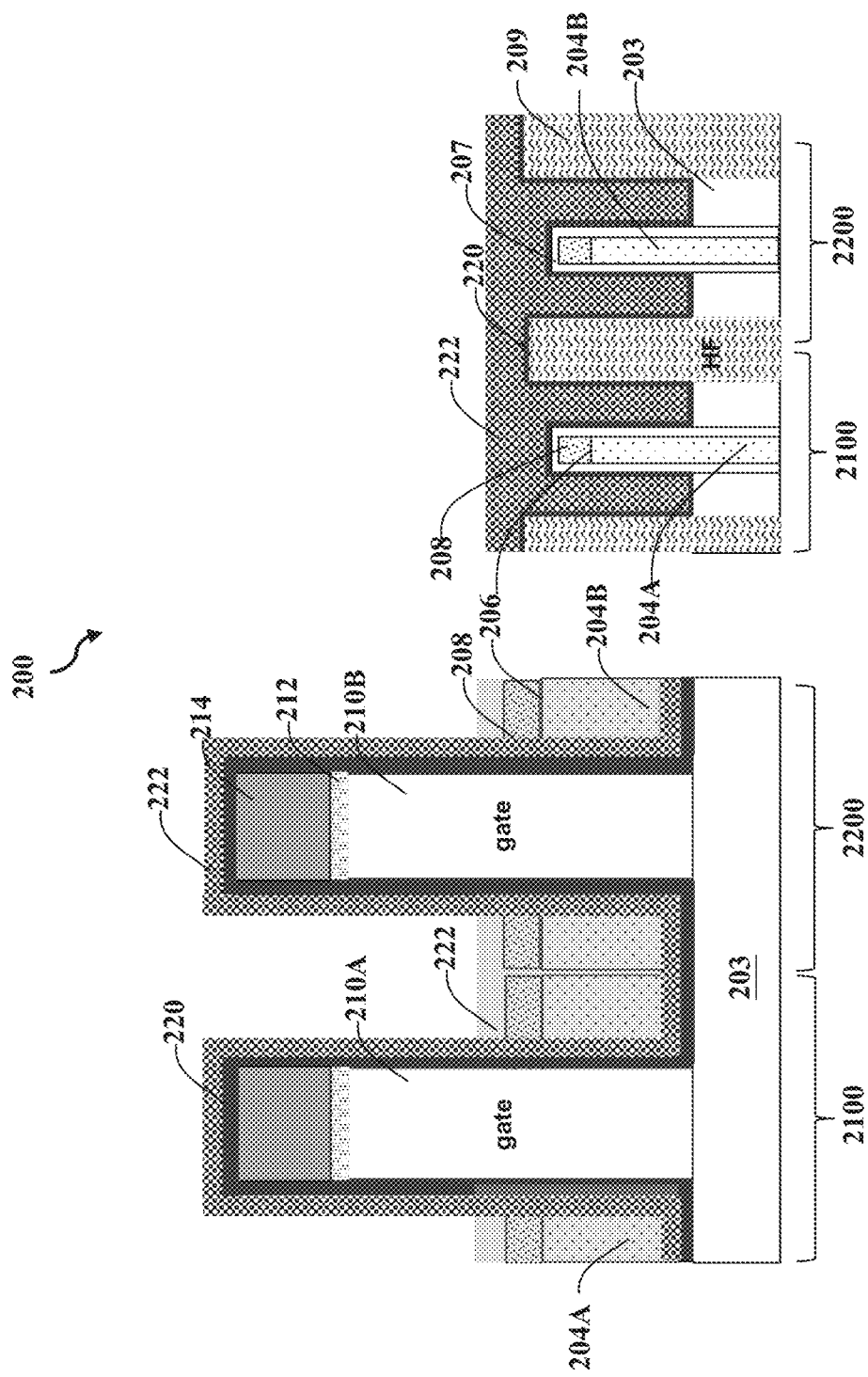

Reference is made to the method 100 in FIG. 1, FIGS. 5A and 5B. The method 100 includes a block 106 where a second spacer 222 is deposited over the workpiece 200, including over the first spacer 220. In some embodiments, the second spacer 222 fills the space defined between the first fin 204A and the dummy fins 209 as well as the space defined between the second fin 204B and the dummy fins 209. In some instances, the second spacer 222 is deposited on the first spacer deposited on sidewalls of the first gate structure 210A, the second gate structure 210B, the first fin 204A, the second fin 204B, the second fin-top hard mask layer 208, and the second gate-top hard mask layer 214. In addition, the second spacer 222 is deposited on the first spacer 220 deposited on top surfaces of the second fin-top hard mask layer 208 and the second gate-top hard mask layer 214. In some embodiments, the second spacer 222 is formed of a dielectric material so selected such that the second spacer 222 may be selectively removed without substantially etching the first spacer 220. In some implementations, the second spacer 222 may comprise silicon, nitrogen, carbon, and oxygen and may be formed to a thickness between about 3 nm and about 6 nm. In some instances, the composition of the second spacer 222 may be represented as $Si_xO_yC_zN_{1-x-y-z}$, where Z is smaller than 20% to impart etching selectivity as compared to the first spacer 220, which has a higher carbon contents. For example, the second spacer 222 may be formed of silicon oxy-carbonitride (SiOCN). In some instances, the second spacer 222 includes oxygen to allow its selective removal without substantially etching the first spacer 220.

Referring now to FIG. 1, FIGS. 6, 7 and 8, the method 100 includes a block 108 where a diamond-shape first source/drain feature 230 is selectively formed adjacent the first gate structure 210A. In some embodiments, the first source/drain feature 230 in the P-type device region 2100 and the second source/drain feature 232 (to be described below) in the N-type device region 2200 are different in terms of composition, doping and/or shape and are formed separately. As illustrated in FIG. 6, in some implementations, a first patterned dummy spacer 224 is deposited over the workpiece 200 such that the source/drain region of the P-type device region 2100 is exposed while the source/drain region of the N-type device region 2200 is masked by the first patterned dummy spacer 224. In that sense, the first patterned dummy spacer 224 functions as a N-type source/drain mask. In some implementations, the material for the first patterned dummy spacer 224 is deposited over the workpiece 200 in a blanket manner using chemical vapor deposition (CVD), atomic layer deposition (ALD), spin-on coating, or other suitable deposition techniques, and then is patterned using photolithography techniques. For example, a photoresist layer, which may include multiple material layers, may be deposited over the deposited material of the first patterned dummy spacer 224. The photoresist layer is then exposed to radiation reflected from or going through a patterned mask. After being subject to a post-exposure bake, the exposed photoresist layer may undergo chemical changes that allow the exposed or the unexposed portions of the photoresist layer to be removed by a developer to form a patterned photoresist layer. The material of the first patterned dummy spacer 224, which is not masked by the patterned photoresist layer is then removed to form the first patterned dummy spacer 224. In some implementations, the first patterned dummy spacer 224 only exposes the source/drain region of the P-type device region 2100 while covering the rest of the workpiece 200. In some instances, the first patterned dummy spacer 224 may include silicon, carbon, and nitrogen, and may be represented as $Si_xC_yN_{1-x-y}$, where Y is less than 10%, to allow selective recess of materials in the source/drain region in the P-type device region 2100.

Figure 7:
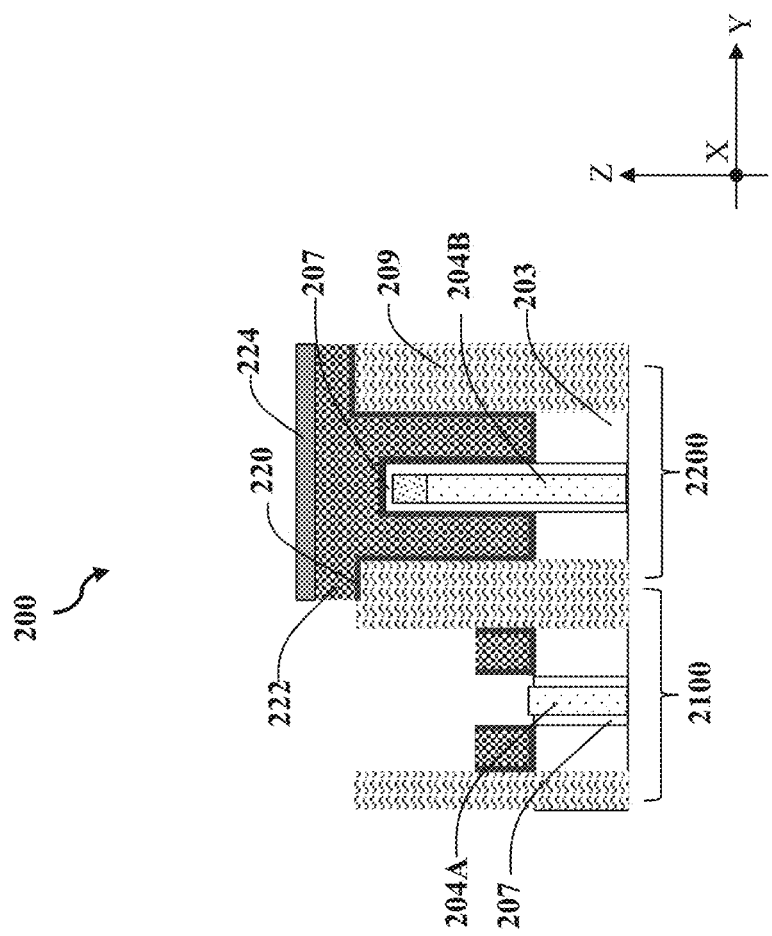

Reference is now made to FIG. 7. In some embodiments, the source/drain region of the P-type device region 2100 is then recessed while the remainder of the workpiece 200 is masked by the first patterned dummy spacer 224. As shown in FIG. 7, the recessing operation at block 108 may remove a portion of the first spacer 220, a portion of the second spacer 222, a portion of the first fin 204A, and a portion of the fin spacer 207, while the dummy fins 209 remains substantially unetched. In some implementations, because the etch rate for the first spacer 220 and the second spacer 222 is smaller than the etch rate for the first fin 204A and the fin spacer 207, after the recess at block 108, the first and second spacers 220 and 222 extend higher than the first fin 204A and the fin spacer 207. In other words, in the source/drain region of the P-type device region 2100, top surfaces of the first and second spacers 220 and 222 are farther away from the isolation structure 203 than top surfaces of the first fin 204A and the fin spacer 207 from the isolation structure 203. In some implementations, the recess of block 108 is performed using dry etch, wet etch, or other suitable etch techniques.

Figure 8:
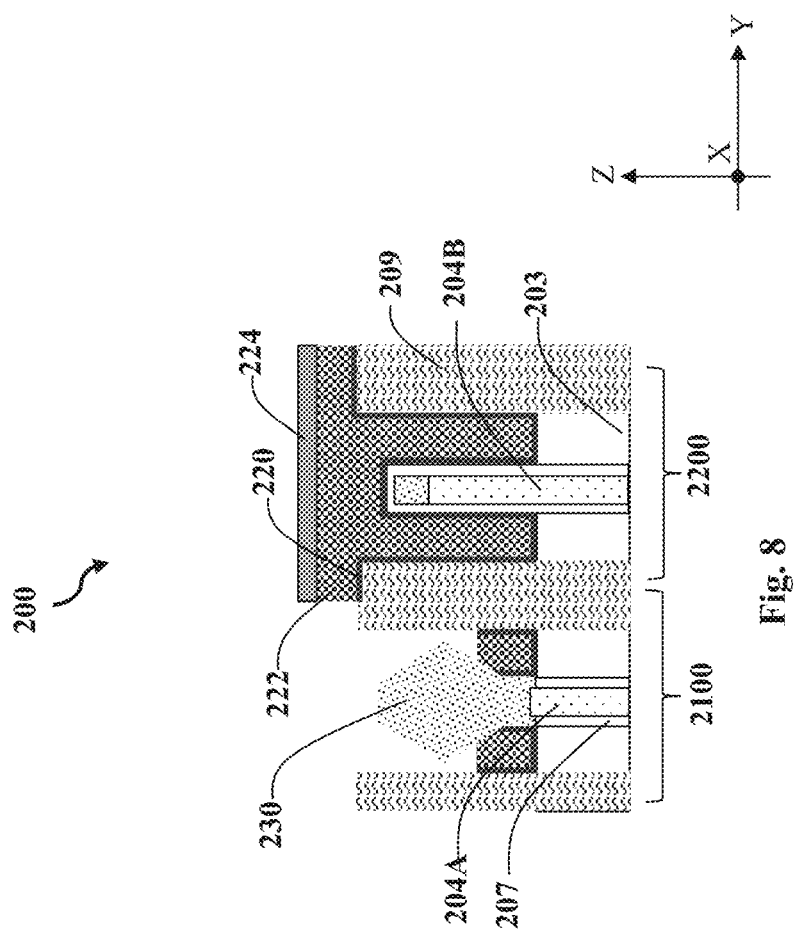

Reference is made to FIG. 8 now. The first source/drain feature 230 is epitaxially formed in the source/drain region of the P-type device region 2100 from the first fin 204A. In some embodiments, the first source/drain feature 230 includes silicon and germanium and may be doped with a P-type dopant, such as boron. In embodiments represented in FIG. 8, the first source/drain feature 230 is epitaxially grown conformally (on all crystal planes) from the top surface of the recessed first fin 204A in the source/drain region of the P-type device region 2100 and for that reason, the first source/drain feature 230 as formed assumes a diamond shape or diamond-like shape when viewed along the X direction. In some embodiments, the first source/drain feature 230 is epitaxially grown at higher temperature, such as above about 600° C., such that the epitaxial growth rates on all crystal planes (such as crystal planes (100) and (111)) are not substantially different. Due to the diamond shape of the first source/drain feature 230 between dummy fins 209, access to the first and second spacers 220 and 222 underneath the first source/drain feature 230 is limited. After the first source/drain feature 230 is formed, the first patterned dummy spacer 224 is removed by dry etch, wet etch, or other suitable etch techniques.

Figure 9:
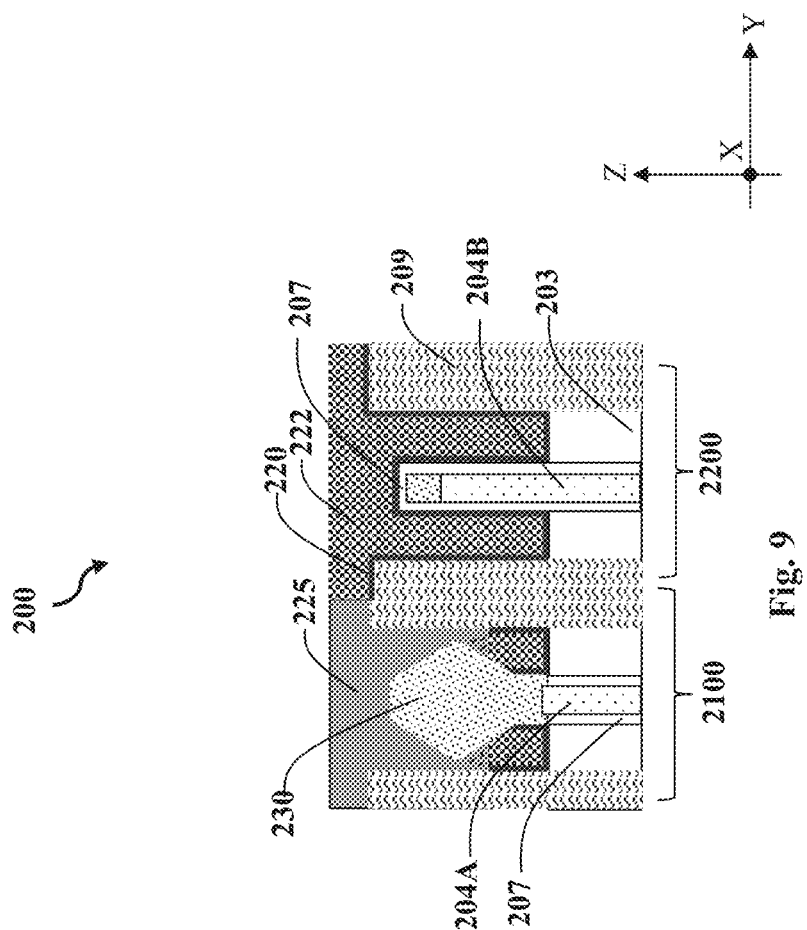
Figure 10:
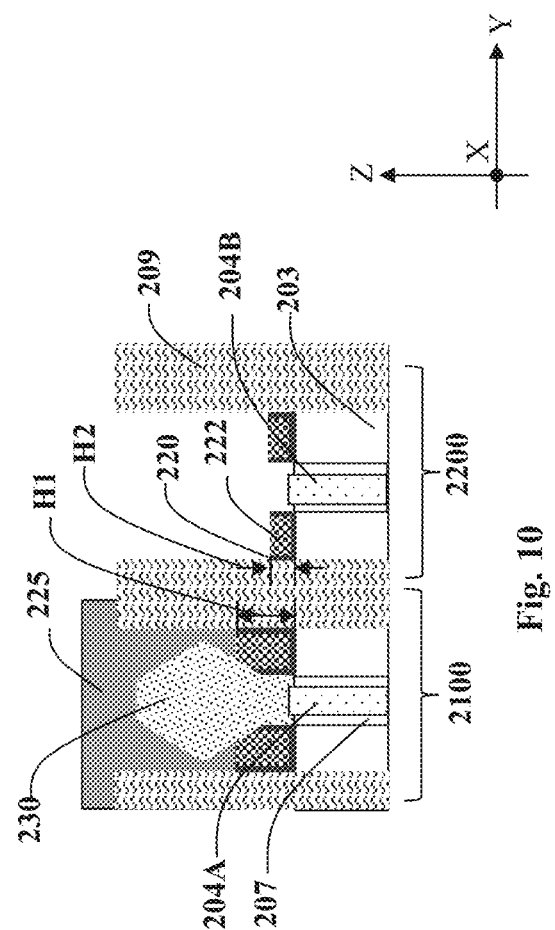

Referring now to FIG. 1, FIGS. 9, 10, 11, 12A, and 12B, the method 100 includes a block 110 where a bar-shape second source/drain feature 232 is selectively formed adjacent the second gate structure 210B. In the embodiments where the first source/drain feature 230 and the second source/drain feature 232 are different in terms of composition, the second source/drain feature 232 is formed while the source/drain region in the P-type device region 2100 is masked by a second patterned dummy spacer 225. The composition and the method of formation of the second patterned dummy spacer 225 may be similar to those of the first patterned dummy spacer 224 and will not be repeated here. The second patterned dummy spacer 225 functions as a P-type source/drain mask. As illustrated in FIG. 9, the source/drain region of the N-type device region 2200 is exposed while the remainder of the workpiece 200 is masked by the second patterned dummy spacer 225. The source/drain region of the N-type device region 2200 is then recessed such that portions of the first spacer 220, the second spacer 222, the second fin 204B, and the fin spacer 207 are recessed. In some embodiments, compared to the first and second spacers 220 and 222 in the source/drain region in the P-type device region 2100, the first and second spacers 220 and 222 in the source/drain region in the N-type device region 2200 is further recessed. In some instances, the etch process is metered by time and the recessing of the source/drain region in the N-type device region 2200 is allowed to go on longer that the recessing of the source/drain region in the P-type device region 2100. In these instances, the first and second spacers 220 and 222 in the P-type device region 2100 has a height H1 from the isolation structure 203 and the first and second spacers 220 and 222 in the N-type device region 2200 has a height H2 from the isolation structure 203. In some implementations, H1 is greater than H2. As will be described below, the smaller H2 allows more strained spacer material to be in contact with the second source/drain feature 232 to exert more tensile stress on the channel region of the N-type device region 2200.

Figure 11:
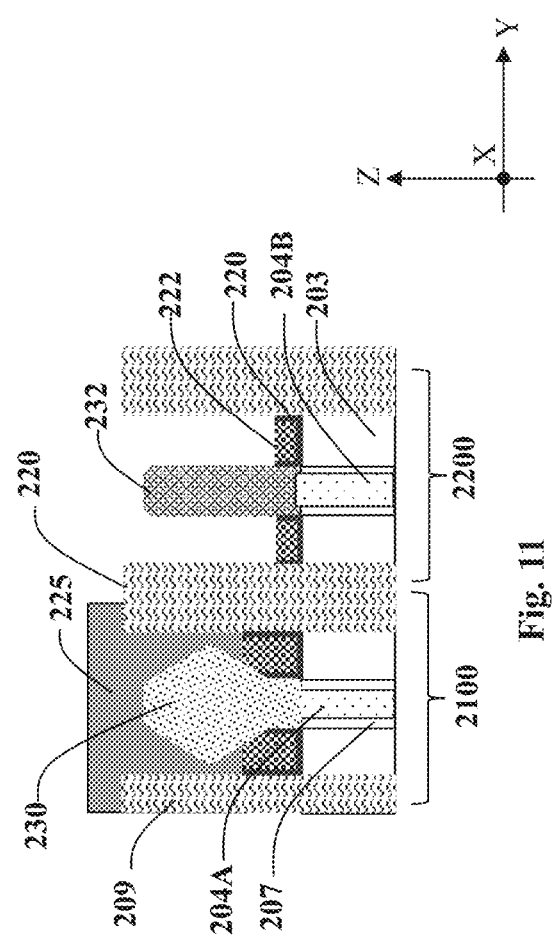

As shown in FIG. 11, the second source/drain feature 232 is epitaxially grown from the recessed second fin 204B. In some embodiments, the second source/drain feature 232 includes silicon and may be doped with an N-type dopant, such as phosphorous. In embodiments represented in FIG. 11, the second source/drain feature 232 is epitaxially grown substantially unidirectionally from the top surface of the recessed second fin 204B in the source/drain region of the N-type device region 2200 and for that reason, the second source/drain feature 232 as formed assumes a bar shape or bar-like shape when viewed along the X direction. In some instances, the second source/drain feature 232 is epitaxially grown under conditions that allow the growth rate along the Z direction is greater than the growth rate along the X direction. For example, the epitaxial deposition process may utilize Le Chatelier's principle in the formation of the second source/drain feature 232 by including both a deposition component that drives the chemical equilibrium towards silicon deposition and an etching component (or stripping component) that drives the chemical equilibrium backwards. In one of such example, silane ($SiH_4$) may be used as the deposition component and hydrochloric acid (HCL) may be used the etching component. By controlling the partial pressures of silane and hydrochloric acid, the second source/drain feature 232 may be formed to have a bar shape. Due to the bar shape of the second source/drain feature 232 between dummy fins 209, access to the first and second spacers 220 and 222 underneath the second source/drain feature 232 is not restricted. After the second source/drain feature 232 is formed, the second patterned dummy spacer 225 is removed by dry etch, wet etch, or other suitable etch techniques.

Figures 12A, 12B:
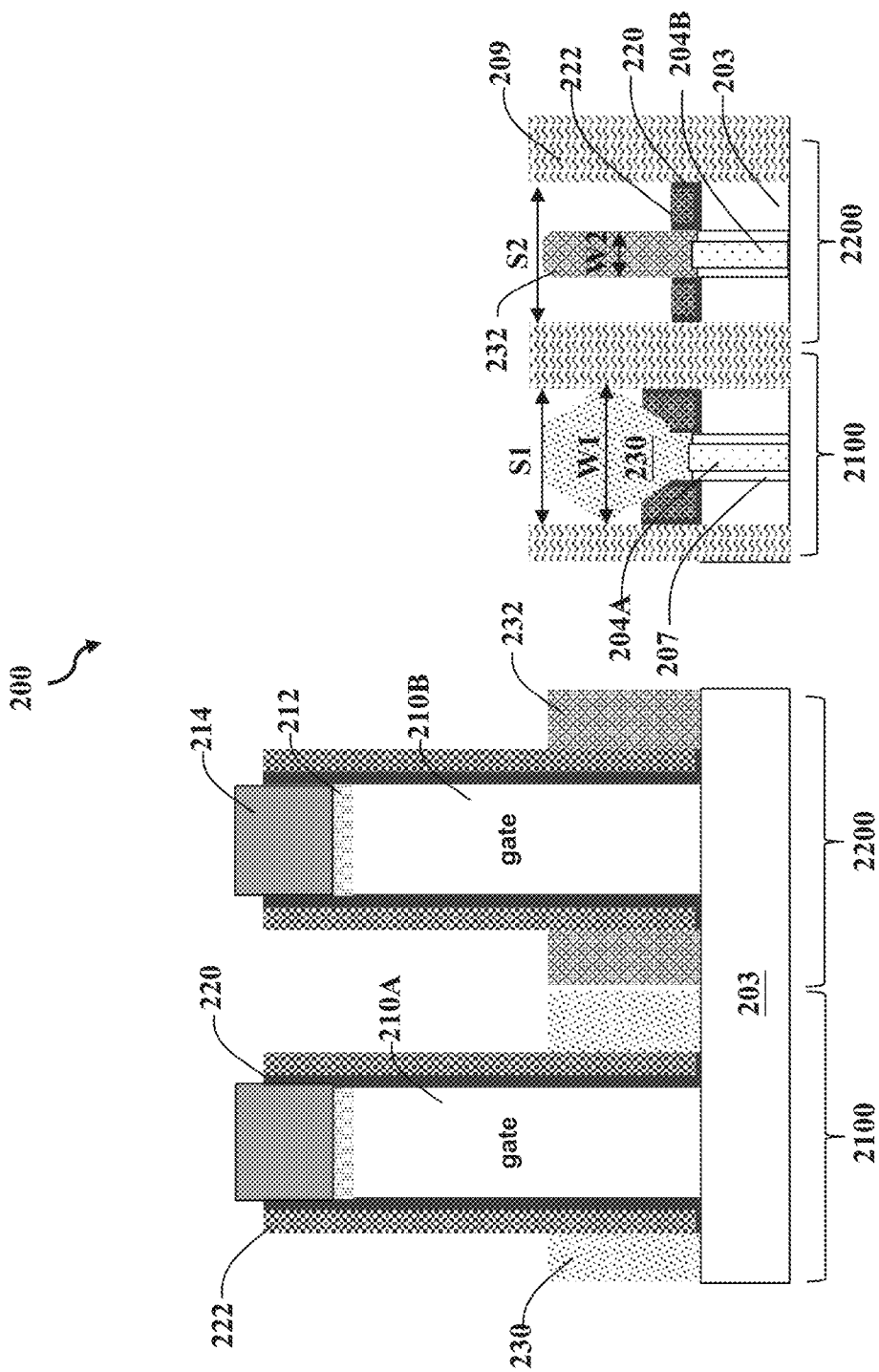

Both the first source/drain feature 230 and the second source/drain feature 232 are illustrated in FIGS. 12A and 12B. The widest portion of the diamond-shape first source/drain feature 230 has a first width W1 and is disposed between two dummy fins 209 which are spaced apart by a first spacing S1. The widest portion of the bar-shape second source/drain feature 232 has a second width W2 and is disposed between two dummy fins 209 which are spaced apart by a second spacing S2. In some embodiments, W1 is more than 75% of S1, including 80% of S1, 90% of S1 and 100% of S1. In some instances, the W1 is substantially equal to S1. In those instances, access to the first and second spacers 220 and 222 beneath the first source/drain feature 230 is completely blocked or hindered. In some embodiments, W2 is less than 50% of S2, including 40% of S2 and 30% of S2. In these embodiments, the access to the first and second spacers 220 and 222 in the source/drain region of the N-type device region 2200 is not block or unhindered. In some embodiments represented in FIG. 12A, one or both the first and second patterned dummy spacers 224 and 226 are not formed over the first and second gate structures 210A and 210B such that the first and second spacers 220 and 222 on top of the second gate-top hard mask layer 214 are removed. In those embodiments, the first and second gate structures 210A and 210B may include a rounded top (not shown).

Referring now to FIG. 1 and FIGS. 13A and 13B, the method 100 includes a block 112 wherein the second spacer 222 is recessed. At block 112, the second spacer 222 is selectively recessed while the first spacer 220 is not recessed. In some embodiments, because the access to the first and second spacers 220 and 222 in the source/drain region in the P-type device region 2100 is blocked or restricted due to the diamond shape of the first source/drain feature 230, the second spacer 222 beneath the first source/drain feature 230 is substantially unetched. In these embodiments, because the access to the first and second spacers 220 and 222 in the source/drain region in the N-type device region 2200 is unhindered thanks to the bar shape of the second source/drain feature 232, the second spacer in the source/drain region of the N-type device region 2200 is removed. In some implementations, the recess operation at block 112 may be achieved by dry etch, wet etch, or other suitable etch techniques. As illustrated in FIG. 13A, the recess of the second spacer 222 at block 112 may expose the second fin 204B adjacent to the first spacer 220 formed on sidewalls of the second gate structure 210B.

Referring now to FIG. 1 and FIGS. 14A and 14B, the method 100 includes a block 114 wherein a third spacer 226 is deposited over the workpiece 200. In some embodiments, the third spacer 226 is deposited using a deposition technique that has good hole-filling capability. For example, the third spacer 226 may be deposited using ALD. As illustrated in FIGS. 14A and 14B, the third spacer 226 is deposited on the first source/drain feature 230, the second source/drain feature 232, sidewalls of the first spacer 220 on the gate structure 210A, top surfaces of the second gate-top hard mask layer 214, and sidewalls of the dummy fins 209. In some embodiments represented in FIG. 14B, when the widest portion of the first source/drain feature 230 is substantially equal to the spacing between the dummy fins 209 (i.e. W1=S1 in FIG. 12B), the access to the space beneath the first source/drain feature 230 is blocked and no third spacer 226 is deposited in the space beneath the first source/drain feature 230. In these embodiments, the bar shape of the second source/drain feature 232 allows unhindered access to the first spacer 220 in the source/drain region in the N-type device region 2200 and the third spacer 226 may fill the space defined by the dummy fins 209, the second source/drain feature 232 and the first spacer 220 in the source/drain region of the N-type device region 2200. In some implementations, the third spacer 226 may be a dielectric material having leaving groups, such as nitrogen or hydrocarbon groups, that may be removed by annealing. After the leaving groups leave the third spacer 226 during anneal, the third spacer 226 may shrink in volume and is compressively strained. The compressively strained third spacer 226 may exert tensile stress on adjacent structures. In some instances, the third spacer 226 may be deposited using silane ($SiH_4$), tri(dimethylamino)silane (TDMAS), alkyl-silane, alkyl-chloro-silane, chlorosilane, ammonia ($NH_3$), hydrazine ($N_2H_4$), combinations thereof, or derivatives thereof as precursors at a temperature between about 300° C. and about 400° C. Such a low deposition temperature range may result in weaker bonding between atoms in the deposited third spacer 226 and such weaker bonding allows leaving groups to be removed at the anneal at block 116. In these instances, after removal of the leaving group at anneal, the third spacer 226 would include silicon, nitrogen, oxygen, carbon, and hydrogen and may be compressively strained due to shrinkage. In some embodiments, the third spacer 226 may be formed of low-temperature silicon nitride layer, which is deposited at a temperature between about 300° C. and about 400° C., which is lower than the temperature range (between 500° C. and 600° C.) for deposition of regular silicon nitride layer. In some implementations, the third spacer 226 may be formed to a thickness between about 3 nm and about 6 nm.

Referring now to FIG. 1 and FIGS. 15A and 15B, the method 100 includes a block 116 where the third spacer 226 is annealed and strained. In some embodiments, the anneal at block 116 may be performed at a temperature sufficient to remove the leaving groups in the third spacer 226 and to compressively strained the same. In some implementations, the anneal temperature at block 116 is between about 700° C. and about 850° C. In some instances, the anneal time at block 116 may be between about 30 minutes and about 2 hours. After the anneal at block 116, the third spacer 226 may become porous as the removal of the leaving groups can leave air gap/pocket behind. In some embodiments, the third spacer 226, after anneal at block 116, has a dielectric constant greater than or equal to 5. In addition, after anneal at block 116, the third spacer 226 may be formed of silicon nitride (SiN), silicon oxide (SiO), or hydrocarbon doped silicon nitride (SiOHCN).

Referring now to FIG. 1 and FIGS. 16A and 16B, the method 100 includes a block 118 where the annealed third spacer 226 is recessed. In some embodiments, the workpiece 200 is subject to an etch to pull back/recess the annealed third spacer 226. In these embodiments, the etch at block 118 may be performed by dry etch, wet etch, or other suitable etch techniques. In embodiments represented in FIGS. 16A and 16B, the annealed third spacer 226 is recessed while the dummy fins 209, the first and second source/drain features 230 and 232, and the first spacer 220 on the first and second gate structures 210A and 210B are substantially unetched. As illustrated in FIGS. 13A, 13B, 14A, 14B, 15A, 15B, 16A, and 16B, blocks 112, 114, 116, and 118 replaces the second spacer 222 in the source/drain region of the N-type device region 2200 with the annealed third spacer 226. As described above, the anneal third spacer 226 is compressively strained and may be referred to as a strained spacer. In that sense, blocks 112, 114, 116, and 118 replaces the second spacer 222, which is not strained (unstrained), with the strained spacer—the annealed third spacer 226.

Reference is still made to FIG. 16B. The strained spacer, i.e. the annealed third spacer 226, substantially fills the space between the second source/drain feature 232 and the dummy fins 209 and exerts a tensile stress on the second source/drain feature 232, as well as on the dummy fins 209. In comparison, while the strained spacer (the annealed third spacer 226) is disposed on top facing surfaces of the first source/drain feature 230, the strained spacer (the annealed third spacer 226) does not fill the space underneath the first source/drain feature 230. As a result, the annealed third spacer 226 exerts little, negligible, or no stress on the first source/drain feature 230. Computer simulations and experiment results have shown that the compressively strained third spacer 226 may exert a tensile stress on the second source/drain feature 232, which in turn exerts a tensile stress on the channel region in the N-type device region 2200. Such tensile stress in the channel region in the N-type device region 2200 can result in improved electron mobility, which may increase drain current and speed. The same cannot be said for the P-type device region. Tensile stress in the channel region of the P-type device region 2100 may cause degradation of hole mobility, resulting in deterioration of the P-type device region 2100. By having the diamond-shape first source/drain feature 230 in the P-type device region 2100 and the bar-shape second source/drain feature 232 in the N-type device region 2200, the methods and devices disclosed herein allow the channel region in the N-type device region 2200 to be stressed/strained for improved performance while maintaining the performance of the channel region in the P-type device region 2100.

Figures 17A, 17B:
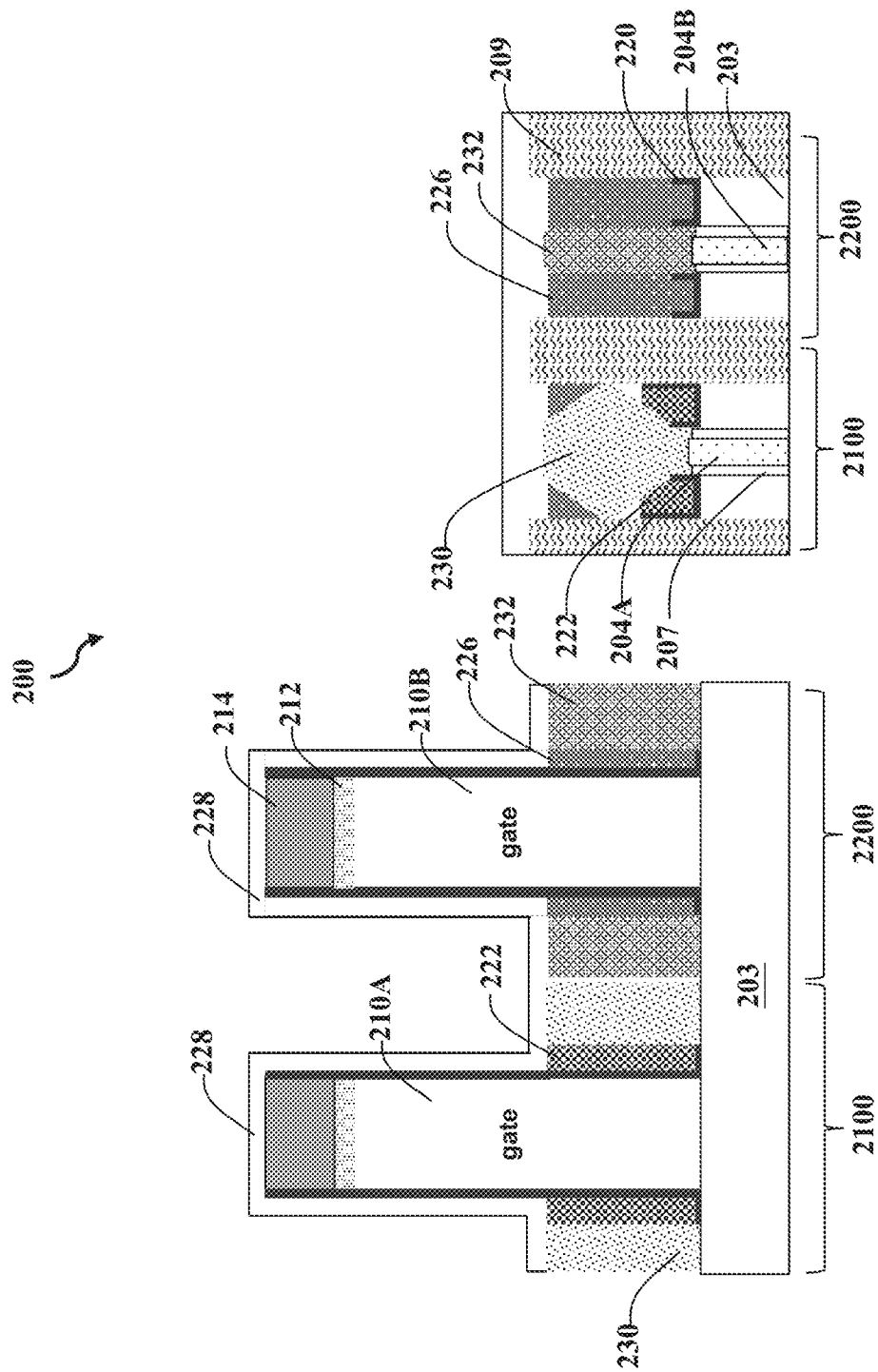

Referring now to FIG. 1 and FIGS. 17A and 17B, the method 100 includes a block 120 where a low-k dielectric layer 228 is deposited over the workpiece 200. In some embodiments, the low-k dielectric layer 228 is formed of a low-k dielectric layer with a dielectric constant between about 2.5 and about 3.5. In some instances, the low-k dielectric layer 228 and the second spacer 222 may be formed of the same material. In some other instances, the low-K dielectric layer 228 may be formed of hydrocarbon-doped silicon nitride (SiOHCN) or silicon oxy-carbonitride (SiOCN). The purpose of the low-k dielectric layer 228 is to reduce parasitic capacitance between gate structures (such as between the first and second gate structures 210A and 210B) and between a gate structure and a conductive feature (such as a source/drain contact). As described above, the annealed third spacer 226 has a dielectric constant between about 5 and about 6 and the low-k dielectric layer 228 has a dielectric constant between about 2.5 and about 3.5. Compared to the annealed third spacer 226 in FIG. 15A, the low-k dielectric layer in FIG. 17A provides lower parasitic capacitance.

Referring now to FIG. 1, the method 100 includes a block 122 where further processes are performed. Such further processes may include formation of interlayer dielectric (ILD) layers over the workpiece 200, formation of source/drain contacts, formation of gate contacts, and formation of interconnect structures.

In one exemplary aspect, the present disclosure is directed to a semiconductor device. The semiconductor device includes a P-type field effect transistor (PFET) and an N-type field effect transistor (NFET). The PFET includes a first gate structure formed over a substrate, a first source/drain feature adjacent to the first gate structure, a first spacer disposed on a sidewall of the first gate structure and in contact with the first source/drain feature, a second spacer disposed over the first spacer and in contact with the first source/drain feature and a first portion of the first spacer disposed on the sidewall of the first gate structure. The NFET includes a second gate structure formed over the substrate, a second source/drain feature adjacent to the second gate structure, the first spacer disposed on a sidewall of the second gate structure and in contact with the second source/drain feature, and a third spacer disposed on a sidewall of the second source/drain feature and in contact with the second source/drain feature and a second portion of the first spacer disposed on the sidewall of the second gate structure. The first spacer is different from the second spacer, the second spacer is different from the third spacer. The second source/drain feature is bar-shaped.

In some embodiments, the third spacer exerts a tensile stress on the second source/drain feature. In some implementations, the semiconductor device may further include a fourth spacer disposed over the sidewall of the first gate structure and the sidewall of the second gate structure. The fourth spacer is in contact with the first spacer, the second spacer, and the third spacer. In some instances, the fourth spacer and the second spacer are formed of the same dielectric material. In some implementations, a dielectric constant of the third spacer is greater than a dielectric constant of the fourth spacer. In some embodiments, the third spacer includes silicon nitride and the fourth spacer includes silicon, oxygen, carbon, hydrogen, or nitrogen. In some instances, the first source/drain feature is between a first dummy fin and a second dummy fin and the second source/drain feature is between a third dummy fin and a fourth dummy fin. In some embodiments, the first, second, third and fourth dummy fins are in contact with the first spacer and the third spacer.

In another exemplary aspect, the present disclosure is directed to a semiconductor device. The semiconductor device includes a P-type field effect transistor (PFET) and an N-type field effect transistor (NFET). The PFET includes a first gate structure formed over a substrate, a first spacer disposed on a sidewall of the first gate structure, and an unstrained spacer disposed on a sidewall of the first spacer. The NFET includes a second gate structure formed over the substrate, the first spacer disposed on a sidewall of the second gate structure, and a strained spacer disposed on a sidewall of the first spacer.

In some embodiments, the first spacer has a first carbon content greater than 40%, the unstrained spacer has a second carbon content smaller than 20%, and the strained spacer includes silicon and nitrogen. In some embodiments, the semiconductor device may further include a first dummy fin, a second dummy fin spaced apart from the first dummy fin by a first distance, a third dummy fin, a fourth dummy fin spaced apart from the third dummy fin by a second distance, a first source/drain feature between the first and second dummy fins along a direction, and a second source/drain feature between the third and fourth dummy fins along the direction. A width of a widest portion of the first source/drain feature along the direction is substantially equal to the first distance. A width of a widest portion of the second source/drain feature along the direction is smaller than the second distance.

In some embodiments, a lower portion of the first source/drain feature extends between two portions of the unstrained spacer and a lower portion of the second source/drain feature extends between two portions of the strained spacer. In some implementations, the semiconductor device may further include a low-k spacer disposed over the first gate structure and the second gate structure. In some implementations, the low-K spacer has a dielectric constant smaller than a dielectric constant of the strained spacer.

In yet another exemplary aspect, the present disclosure is directed to a method. The method includes providing a workpiece. The workpiece includes a first fin in a P-type device region, the first fin being between a first dummy fin and a second dummy fin along a direction, a second fin in an N-type device region, the second fin being between a third dummy fin and a fourth dummy fin along the direction, a first gate structure over the first fin, and a second gate structure over the second fin. The method further includes depositing a first spacer over the workpiece, including over the first and second gate structures, depositing a second spacer over the first spacer, selectively forming a first source/drain feature over the first fin adjacent the first gate structure, selectively forming a second source/drain feature over the second fin adjacent the second gate structure, replacing the second spacer in the N-type device region with a third spacer, annealing the third spacer to impart a tensile stress in the third spacer, recessing the annealed third spacer to expose the first spacer deposited over the first and second gate structures, and depositing a low-k dielectric layer over the exposed first spacer over the first and second gate structures.

In some embodiments, the selectively forming of the first source/drain feature includes forming the first source/drain feature in a diamond shape. The selectively forming of the second source/drain feature includes forming the second source/drain feature in a bar shape. In some implementations, the first dummy fin is spaced apart from the second dummy fin by a first distance along the direction, the third dummy fin is spaced apart from the fourth dummy fin by a second distance along the direction, a width of a widest portion of the first source/drain feature along the direction is substantially equal to the first distance, and a width of a widest portion of the second source/drain feature along the direction is smaller than the second distance. In some instances, the second spacer and the low-k dielectric layer are formed of the same dielectric material. In some embodiments, the replacing of the second spacer in the N-type device region includes recessing the second spacer in the N-type device region and depositing the third spacer in the N-type device region. In some embodiments, the depositing of the third spacer includes a temperature between about 300° C. and about 400° C.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A semiconductor device, comprising:
  a first field effect transistor (FET) that includes:
    a first source/drain feature and a second source/drain feature, and
    a first fin sandwiched between the first source/drain feature and the second source/drain feature along a first direction; and
  a second FET that includes:
    a third source/drain feature and a fourth source/drain feature, and
    a second fin sandwiched between the third source/drain feature and the fourth source/drain feature along the first direction,
  wherein the first source/drain feature and the second source/drain feature are diamond-shaped when viewed along the first direction,
  wherein the third source/drain feature and the fourth source/drain feature are bar-shaped when viewed along the first direction,
  wherein the first source/drain feature is disposed between a first dielectric fin and a second dielectric fin along a second direction perpendicular to the first direction, wherein the third source/drain feature is disposed between a third dielectric fin and a fourth dielectric fin along the second direction.

2. The semiconductor device of claim 1,
wherein the first FET is a p-type FET, and
wherein the second FET is an n-type FET.

3. The semiconductor device of claim 1,
wherein the first source/drain feature and the second source/drain feature comprise silicon germanium and a p-type dopant,
wherein the third source/drain feature and the fourth source/drain feature comprise silicon and an n-type dopant.

4. The semiconductor device of claim 1, further comprising:
an isolation structure surrounding lower portions of the first fin and the second fin,
wherein the first dielectric fin, the second dielectric fin, the third dielectric fin, and the fourth dielectric fin extend into the isolation structure.

5. The semiconductor device of claim 1,
wherein a widest portion of the first source/drain feature comprises a first maximum width along the second direction,
wherein a widest portion of the third source/drain feature comprises a second maximum width along the second direction, and
wherein the first maximum width is greater than the second maximum width.

6. The semiconductor device of claim 5,
wherein the first dielectric fin and the second dielectric fin comprises a spacing along the second direction,
wherein the first maximum width is more than 75% of the spacing.

7. The semiconductor device of claim 5,
wherein the third dielectric fin and the fourth dielectric fin comprises a spacing along the second direction,
wherein the second maximum width is less than 40% of the spacing.

8. The semiconductor device of claim 1, wherein a widest portion of the first source/drain feature is in direct contact with the first dielectric fin and the second dielectric fin.

9. A semiconductor structure, comprising:
a p-type field effect transistor (PFET) that includes:
a first source/drain feature and a second source/drain feature,
a first fin sandwiched between the first source/drain feature and the second source/drain feature along a first direction, and
a first dielectric fin and a second dielectric fin sandwiching the first source/drain feature along a second direction perpendicular to the first direction; and
an n-type FET (NFET) that includes:
a third source/drain feature and a fourth source/drain feature,
a second fin sandwiched between the third source/drain feature and the fourth source/drain feature along the first direction, and
a third dielectric fin and a fourth dielectric fin sandwiching the third source/drain feature along the second direction,
wherein a widest portion of the first source/drain feature comprises a first maximum width along the second direction,
wherein a widest portion of the third source/drain feature comprises a second maximum width along the second direction, and wherein the first maximum width is greater than the second maximum width.

10. The semiconductor structure of claim 9,
wherein the first source/drain feature and the second source/drain feature are diamond-shaped when viewed along the first direction,
wherein the third source/drain feature and the fourth source/drain feature are bar-shaped when viewed along the first direction.

11. The semiconductor structure of claim 9,
wherein the PFET further comprises:
a first gate structure wrapping over the first fin and disposed adjacent the first source/drain feature and the second source/drain feature,
a first spacer disposed on a sidewall of the first gate structure and in contact with the first source/drain feature, and
a second spacer disposed over the first spacer,
wherein the NFET further comprises:
a second gate structure wrapping over the second fin and disposed adjacent the third source/drain feature and the fourth source/drain feature,
the first spacer disposed on a sidewall of the second gate structure and in contact with the first source/drain feature, and
a third spacer disposed over the first spacer, and
wherein a composition of the second spacer is different from a composition of the third spacer.

12. The semiconductor structure of claim 11,
wherein the second spacer comprises silicon oxycarbonitride,
wherein the third spacer comprises silicon nitride.

13. The semiconductor structure of claim 11,
wherein the first spacer has a first carbon content greater than 40%,
wherein the second spacer has a second carbon content smaller than 20%.

14. The semiconductor structure of claim 11, wherein the third spacer exerts a tensile stress on the first fin.

15. A method, comprising:
providing a workpiece, the workpiece comprising:
a first fin in a P-type device region,
a second fin in an N-type device region,
a first gate structure over the first fin, and
a second gate structure over the second fin;
depositing a first spacer over the workpiece, including over the first and second gate structures;
depositing a second spacer over the first spacer;
selectively forming a first source/drain feature over the first fin adjacent the first gate structure;
selectively forming a second source/drain feature over the second fin adjacent the second gate structure;
replacing the second spacer in the N-type device region with a third spacer; and
annealing the third spacer to impart a tensile stress in the third spacer.

16. The method of claim 15,
wherein the selectively forming of the first source/drain feature comprises forming the first source/drain feature in a diamond shape,
wherein the selectively forming of the second source/drain feature comprises forming the second source/drain feature in a bar shape.

17. The method of claim 15, wherein the replacing of the second spacer in the N-type device region comprises:
   recessing the second spacer in the N-type device region; and
   depositing the third spacer in the N-type device region.

18. The method of claim 15, wherein the annealing of the third spacer comprises an anneal temperature between about 700° C. and about 850° C. and an anneal time between about 30 minutes and about 2 hours.

19. The method of claim 15,
   wherein the selectively forming of the first source/drain feature comprises:
      selectively recessing a source/drain region of the first fin, and
      depositing the first source/drain feature over the recessed source/drain region of the first fin,
   wherein the selectively forming of the second source/drain feature comprises:
      after the depositing of the first source/drain feature, selectively recessing a source/drain region of the second fin, and
      depositing the second source/drain feature over the recessed source/drain region of the second fin.

20. The method of claim 19, wherein the selectively depositing the first source/drain feature comprises a process temperature greater than 600° C. such that the deposition of the first source/drain feature on all crystal planes are substantially the same.

* * * * *